United States Patent [19]

Saigo et al.

[11] Patent Number: 5,798,934
[45] Date of Patent: *Aug. 25, 1998

[54] BATTERY REMAINING CAPACITY MEASURING DEVICE

[75] Inventors: Tsutomu Saigo; Kenichi Shimoyama, both of Susono, Japan

[73] Assignee: Yazaki Corporation, Tokyo, Japan

[*] Notice: The term of this patent shall not extend beyond the expiration date of Pat. No. 5,617,324.

[21] Appl. No.: 738,863

[22] Filed: Oct. 28, 1996

[30] Foreign Application Priority Data

Oct. 30, 1995 [JP] Japan ................ 7-281849

[51] Int. Cl.$^6$ ........................... G01R 19/00
[52] U.S. Cl. ............. 364/483; 364/481; 320/48; 320/43; 324/427; 324/428
[58] Field of Search .......... 364/483, 481; 324/427, 430, 431, 428; 429/92; 320/48, 43, 39, 35

[56] References Cited

U.S. PATENT DOCUMENTS 5,617,324 4/1997 Arai ................... 364/483

FOREIGN PATENT DOCUMENTS 6-34727  2/1994  Japan .

Primary Examiner—Emanuel Todd Voeltz
Assistant Examiner—Demetra R. Smith
Attorney, Agent, or Firm—Oblon, Spivak, McClelland, Maier & Neustadt, P.C.

[57] ABSTRACT

A current/voltage detecting section detects current flowing through a load and terminals voltage of a battery. A correlation determining section obtains the correlation coefficient between a plurality of current values and a plurality of voltage values detected by the current/voltage detecting section to determine whether or not the correlation coefficient is equal to or less than the predetermined value. A data acquisition range determining section determines a data acquisition range adjacent to the previous approximating line stored in a memory when the predetermined values is determined as equal to or less than the predetermined value, and deletes data which are not included in the data acquisition range from the plurality of the current values and the plurality of the voltage values detected by the current/voltage detecting section. An approximating line calculating section calculates the approximating line to be stored in the memory based on a plurality of current values and a plurality of voltage values determined by the data acquisition range determining section. A remaining capacity calculating section calculates the remaining capacity of battery based on the plurality of the current values and the plurality of the voltage values determined by the data acquisition range determining section.

8 Claims, 4 Drawing Sheets

| NUMBER | 1 | --- | i-3 | i-2 | i-1 | i | i+1 | --- |
|---|---|---|---|---|---|---|---|---|
| CORRELATION COEFFICIENT | -0.98 | --- | -0.92 | -0.85 | -0.5 | -0.95 | -0.96 | --- |
| n | 0 | --- | --- | 0 | 1 | 2 | 0 | --- |

REFERENCE DATA USED FOR SETTING
DATA ACQUISITION RANGE
$I = A_{i-n-1} \times V + B_{i-n-1}$

BATTERY REMAINING CAPACITY MEASURING DEVICE

BACKGROUND OF THE INVENTION

This invention relates to a battery remaining capacity measuring device, more particularly, to a battery remaining capacity measuring device for specifying a data acquisition range to accurately obtain an approximating line.

In general, a battery has a different discharge characteristic depending upon a variation of a load connected thereto, an ambient temperature, an aged deterioration and the like. Accordingly, a remaining capacity of the battery is different depending upon the variation of the load, the ambient temperature, the aged deterioration and the like.

Since an electric vehicle is powered by the battery, the remaining capacity of the battery needs to be accurately predicted. Japanese Patent Laid-Open No.6-34727 discloses a conventional method for measuring the remaining capacity of the battery. This method will be simply explained hereinbelow. A relation between a current value and terminals voltage upon current flowing through a load is obtained as a V-I characteristic. Generally, this V-I characteristic and the remaining capacity of the battery have a good correlation therebetween. Thus, the relation between them is pre-stored, and the remaining capacity is determined and displayed by a relation between actually determined V-I characteristic and the stored relation therebetween.

However, a degree of change in voltage and current does not always have a correlation. It is considered that the terminal voltage of the battery does not follow an abrupt change of a current discharged from the battery when the load abruptly changes.

Particularly, a phenomenon occurs that a plurality of measured voltage values and current values are concentrated around one place by regenerative braking and the like.

In addition, when the battery is mounted on the electric vehicle, there is a case as shown in FIG. 5 where the voltage values and the current values are collected at points extremely far from the dispersed point of these data (hereinafter called "a singular point"), which is caused by noises of the electric vehicle.

Consequently, there exists a problem that the remaining capacity is not accurately determined in such a case.

SUMMARY OF THE INVENTION

This invention is made to solve the problems described above, and is directed to provide a battery remaining capacity measuring device for determining an accurate remaining capacity voltage based on data with the exception of at least a singular point.

It is therefore an object of this invention to provide a battery remaining capacity measuring device, comprising: storing means for storing therein the approximating line data; current/voltage detecting means for detecting current flowing through a load and terminals voltage of a battery; correlation determining means for calculating a correlation coefficient between a plurality of current values and a plurality of voltage values detected by the current/voltage detecting means at every predetermined time, and for determining whether or not the correlation coefficient is equal to or less than a predetermined value; data acquisition range determining means for determining a data acquisition range adjacent to a previous approximating line stored in the storing means when the correlation coefficient is determined as equal to or less than the predetermined value, and for deleting data which are not included in the data acquisition range from the plurality of the voltage values and the plurality of the current values detected by the current/ voltage detecting means; approximating line calculating means for calculating a approximating line based on a plurality of voltage values and a plurality of current values determined by the data acquisition range determining means, and for storing the approximating line in the storing means; and remaining capacity calculating means for calculating a remaining capacity of the battery based on the plurality of the voltages values and the plurality of the current values determined by the data acquisition range determining means.

According to the present invention, the approximating line is calculated by deleting the singular point which is not reliable upon calculating the approximating line, therefore it is possible to measure the remaining capacity of the battery accurately.

According to a preferred aspect of the invention, although the correlation coefficient is determined as equal to or less than the predetermined value by the correlation determining means, when the previous approximating line data stored in the storing means are data before an elapse of a predetermined time, the data acquisition determining range means does not carry out its process, and a approximating line is calculated based on the plurality of the voltage values and the plurality of the current values obtained by the approximating line calculating means.

According to a preferred aspect of the invention, the battery remaining capacity measuring device further comprising second storing means for storing therein the plurality of the current values and the plurality of the voltage values detected by the current/voltage detecting means, wherein the data acquisition determining means is for deleting the data which are not included in the data acquisition range from the plurality of the current values and the plurality of the voltage values stored in the second storing means, the approximating line calculating means for calculating the approximating line based on the plurality the current values and the plurality of the voltage values stored in the second storing means.

According to a preferred aspect of the invention, the battery remaining capacity measuring device has a second storing means correspondingly storing therein data collected number, the correlation coefficient, and correlation determined number.

According to a preferred aspect of the invention, the battery remaining capacity measuring device further comprises a display means for displaying the remaining capacity of the battery calculated by the remaining capacity calculating means.

According to a preferred aspect of the invention, the battery remaining capacity measuring device comprises the approximating line calculating means for calculating the approximating line by least square method.

According to a preferred aspect of the invention, in the battery remaining capacity measuring device, the predetermined value of the correlation coefficient in the correlation determining means is set to −0.9.

According to a preferred aspect of the invention, in the battery remaining capacity measuring device, the plurality of the current values and the plurality of the voltage values are pair data of 100 pieces.

The nature, principle and utility of the invention will become more apparent from the following detailed description when read in conjunction with the accompanying drawings.

3

DESCRIPTION OF THE PREFERRED EMBODIMENTS

Preferred embodiments of this invention will be clearly understood from the following description by referring to the accompanying drawings.

Figure 1:
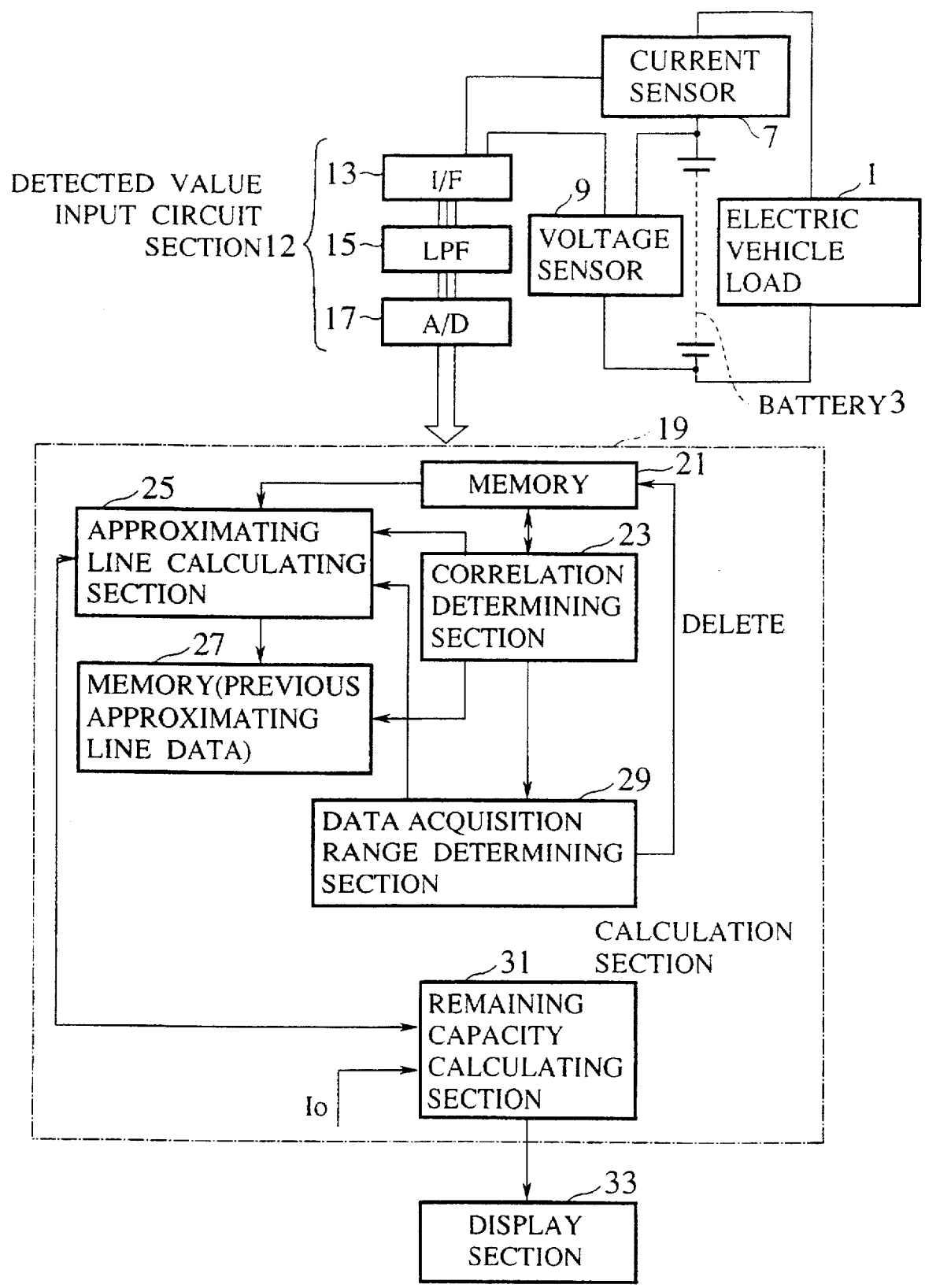
FIG. 1 is a schematic arrangement of a battery remaining capacity measuring device according to an embodiment of this present invention.

FIG. 1 shows a schematic arrangement of a battery remaining capacity measuring device according to an embodiment of this present invention. Referring to FIG. 1, reference numeral 1 denotes an electric vehicle load (for example a motor )connected to a battery 3, reference numeral 7 denotes a current sensor for detecting current flowing through the electric vehicle load (hereinafter simply called "a load"), and reference numeral 9 denotes a voltage sensor for detecting terminals voltage of the battery 3.

Reference numeral 12 denotes a detected value input circuit section. The detected value input circuit section 12 comprises an Interface(I/F) 13, a low-pass filter(LPF) 15, and an analogue/digital converter(A/D) 17, receives the current and voltage of the battery 3 from the voltage sensor 9 and the current sensor 7 at every predetermined time, and converts them into digital values after removing noise therefrom to store these data in a memory 21.

Reference numeral 19 denotes a calculation section. The calculation section 19 comprises a correlation determining section 23, an approximating line calculating section 25, a data acquisition range determining section 29, and a remaining capacity calculating section 31.

The correlation determining section 23 obtains, at every predetermined time, a correlation coefficient between a plurality of voltage values and a plurality of current values stored in the memory 21, and determines whether or not this correlation coefficient is equal to or less then −0.9. When it is determined that the correlation coefficient is equal to or less than −0.9, the correlation determining section 23 informs the data acquisition range determining section 29 of the tendency of the previous approximating line stored in a memory 27(an obtained approximating line based on the data when the correlation coefficient equal to or less than −0.9 is obtained) and a coordinate value and the like.

The approximating line calculating section 25, when activated, reads a plurality of the voltage values and a plurality of the current values stored in the memory 21, takes the total sum of squares of errors therebetween, then determines A, B to minimize the errors, and based on the A, B, a voltage-current approximating line (I=A·V+B) is determined.

The data acquisition range determining section 29, reads the previous approximating line of the correlation coefficient equal to or less than −0.9 from the memory 27 each time when the correlation coefficient equal to or less than −0.9 is obtained by the correlation determining section 23, and

4 determines the range adjacent to this line as a data range with the exception of a singular point (hereinafter called "a data acquisition range").

Thereafter, the data which are not included in this data acquisition range are deleted from the memory 21 to activate the approximating line calculating section 25.

The remaining capacity calculating section 31, each time when the approximating line is obtained, specifies a voltage value V on voltage-current axes based on the predetermined current value to display this voltage value V on a display section 33.

Figure 2:
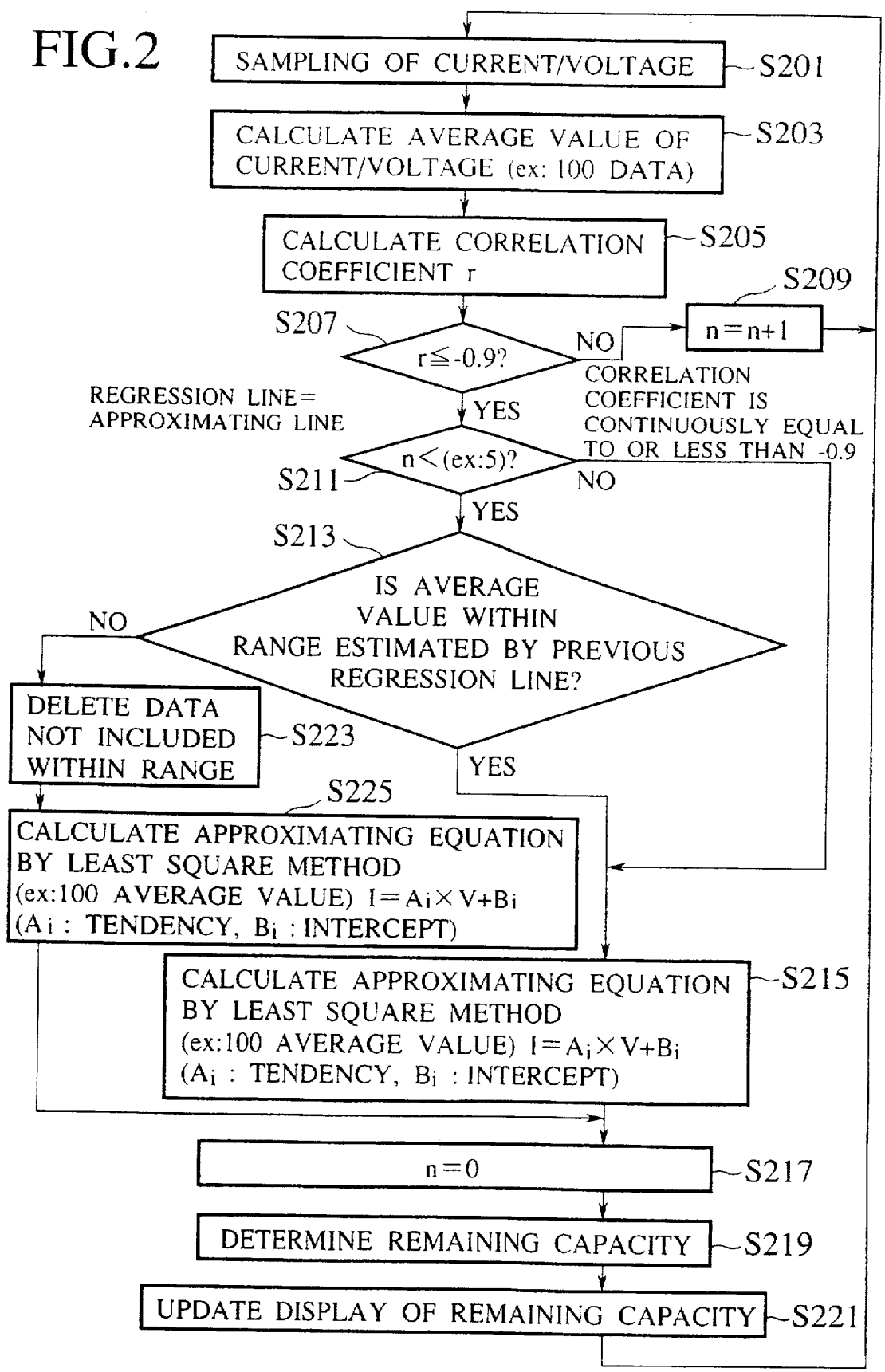
FIG. 2 is a flow chart explaining an operation of a battery remaining capacity measuring device of this invention.

Description will now be made with regard to an operation of the battery remaining capacity measuring device as arranged above. FIG. 2 is a flow chart explaining the operation of the battery remaining capacity measuring device. The detected value input circuit section 12 samples the voltage value of the battery 3 detected by the voltage sensor 9 and the current value flowing through the load 1 detected by the current sensor 7(Step 201). The sampling is performed, for example, every 1 msec.

Thereafter, the correlation determining section 23 averages the data collected for the elapse of 10 msec, for instance, and obtains 100 pieces of the averaged voltage and current (dispersed data) (Step 203). That is, 100 pieces of the average voltage and the average current are collected in 10 seconds.

Next, the correlation determining section 23 obtains a correlation coefficient r from the dispersed data of the voltage and the current (Step 205), and determines whether or not that the obtained correlation coefficient r is equal to or less than −0.9 (Step 207). When determined in Step 207 that the correlation coefficient is more than −0.9, a counter value n (hereinafter called "a correlation determined number n") is updated, wherein the counter value n is for counting numbers when the correlation coefficient is equal to or more than −0.9 (Step 209). Then, the process goes back to the Step 201 to determine the next correlation coefficient.

When determined in Step 207 that the correlation coefficient is equal to or less than −0.9, a determination is made whether or not that the correlation determined number n is, for example, below 5 (Step 211).

At this time, the correlation determining section 23 correspondingly stores data collected number, the correlation coefficient, and the correlation determined number n in the memory 27.

Thereafter, when determined in Step 211 that the correlation determined number n is below 5, the data acquisition range determining section 29 is activated to read the previous approximating line stored in the memory 27 and to determine the data acquisition range adjacent to the previous approximating line, and then determines whether or not this data acquisition range includes data in the memory 21 (Step 213).

Figure 3:
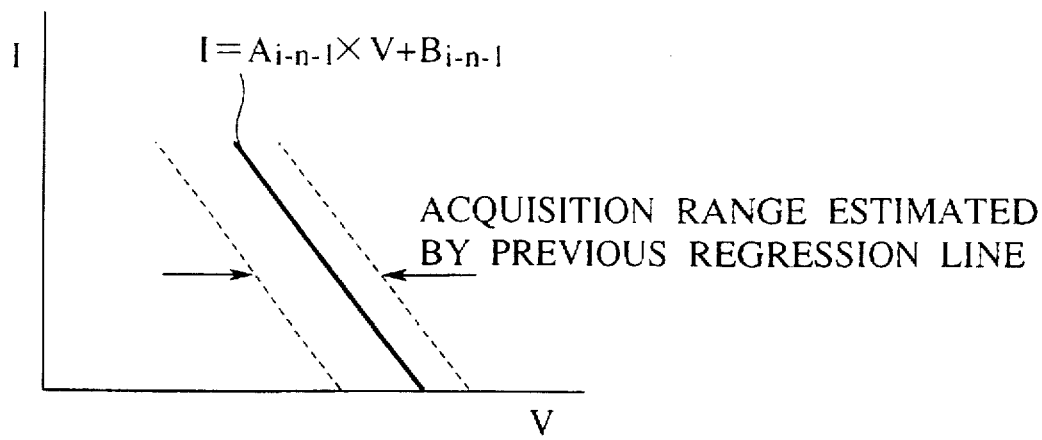
FIG. 3 is a graph explaining a data acquisition range.

For example, when the previous approximating line ($I=A_{i-n-1} \times V + B_{i-n-1}$) is positioned on coordinates axes as illustrated in FIG. 3 (the vertical line may be a voltage axis and the horizontal axis may be a current axis), the range surrounded by dotted-line is regarded as the data acquisition range.

Figure 4:
FIG. 4 is a chart explaining a method for determining the previous approximating line.

Referring to FIG. 4, the correlation coefficient determining section 23 correspondingly stores values of the correlation coefficient, the data collected number, and the correlation determined number n in the memory 27. Thus, for example, if the correlation coefficients are (−0.92), (−0.85) and (−0.5) when the collected numbers are i−3, i−2, and i−1, since the approximating line is obtained at −0.92, this approximating line is regarded as the previous approximating line.

Thereafter, when determined in Step 213 that all data are included in the data acquisition range determined by the previous approximating line, the approximating line calculating section 25 is activated to determine the approximating line by least square method (Step 215) to clear the correlation determined number n (Step 217).

Next, the remaining capacity calculating section 31 determines the remaining capacity (a remaining capacity voltage) based on the approximating line calculated by the approximating line calculating section 25 and a pre-set reference current Io (Step 219).

The remaining capacity calculating section 31 updates the previous remaining capacity to the obtained new remaining capacity and outputs it to the display section 33 (Step 221), and the process goes back to Step 201.

Further, when the memory 21 has the data (singular point data) which are not included in the data acquisition range at Step 213, the data of the singular point are deleted (Step 223). After deleting the data of the singular point, the data acquisition range determining section 29 activates the approximating line calculating section 25. The approximating line calculating section 25 obtains the approximating line based on the plurality of data in the memory 21 (Step 225) and moves to Step 217 where the correlation determining number n is cleared to make the remaining capacity calculating section 31 determine the remaining capacity (remaining capacity voltage).

When it is determined in Step 211 that the correlation determined number n is equal to or more than 5, i.e. the data having the previous correlation coefficient equal to or less than −0.9 are obtained before the elapse of the predetermined time, there is no need to refer to the previous approximating line, therefore, the determination for the singular point is not made, the process moves to Step 215 where the approximating line is obtained based on all data currently acquired.

Figure 5:
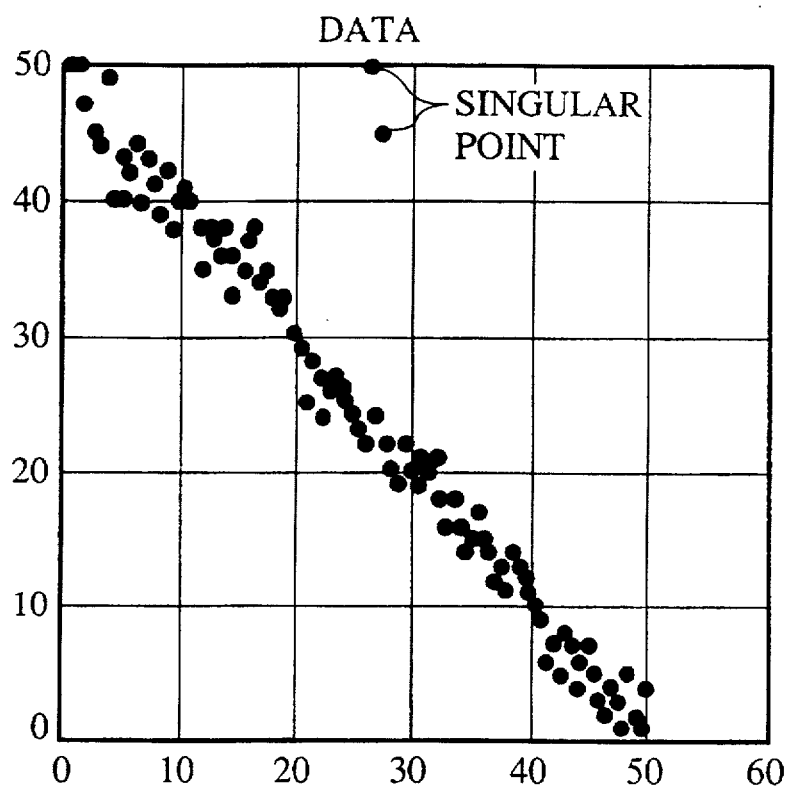
FIG. 5 is a graph showing a correlation between a current value and a voltage value.

Accordingly, when the plurality of voltage values and the plurality of current values are collected, even if there is the collected data extremely far from the dispersed point of these data as shown in FIG. 5, which is so called the singular point, the data of singular points are deleted and then the approximating line is determined, consequently, it is possible to obtain the accurate remaining capacity voltage.

In the above embodiment, the description is made with regard to the battery remaining capacity measuring device for use in the electric vehicle, but it may be applied to other devices in which discharge current abruptly varies.

Further, the collecting time is set to 10 seconds in the above embodiment, it may be set longer or shorter according to a device to be mounted.

What is claimed is:

1. A battery remaining capacity measuring device, comprising:

storing means for storing therein the approximating line data;

current/voltage detecting means for detecting current flowing through a load and terminals voltage of a battery;

correlation determining means for calculating a correlation coefficient between a plurality of current values and a plurality of voltage values detected by said current/voltage detecting means at every predetermined time, and for determining whether or not said correlation coefficient is equal to or less than a predetermined value;

data acquisition range determining means for determining a data acquisition range adjacent to a previous approximating line stored in said storing means when said correlation coefficient is determined as equal to or less than said predetermined value, and for deleting data which are not included in said data acquisition range from the plurality of the voltage values and the plurality of the current values detected by said current/voltage detecting means;

approximating line calculating means for calculating a approximating line based on a plurality of voltage values and a plurality of current values determined by said data acquisition range determining means, and for storing the approximating line in said storing means; and remaining capacity calculating means for calculating a remaining capacity of said battery based on the plurality of the voltages values and the plurality of the current values determined by said data acquisition range determining means.

2. A battery remaining capacity measuring device as claimed in claim 1, wherein although said correlation coefficient is determined as equal to or less than said predetermined value by said correlation determining means, when the previous approximating line data stored in said storing means are data before an elapse of a predetermined time, said data acquisition determining range means does not carry out its process, and a approximating line is calculated based on the plurality of the voltage values and the plurality of the current values obtained by said approximating line calculating means.

3. A battery remaining capacity measuring device as claimed in claim 1, further comprising second storing means for storing therein the plurality of the current values and the plurality of the voltage values detected by said current/voltage detecting means, wherein said data acquisition determining means is for deleting the data which are not included in said data acquisition range from the plurality of the current values and the plurality of the voltage values stored in said second storing means, said approximating line calculating means for calculating the approximating line based on the plurality the current values and the plurality of the voltage values stored in said second storing means.

4. A battery remaining capacity measuring device as claimed in claim 3, wherein said second storing means correspondingly stores therein data collected number, said correlation coefficient, and correlation determined number.

5. A battery remaining capacity measuring device as claimed in claim 1, further comprising display means for displaying the remaining capacity of said battery calculated by said remaining capacity calculating means.

6. A battery remaining capacity measuring device as claimed in claim 1, wherein said approximating line calculating means is for calculating said approximating line by least square method.

7. A battery remaining capacity measuring device as claimed in claim 1, wherein said predetermined value of said correlation coefficient in said correlation determining means is set to −0.9.

8. A battery remaining capacity measuring device as claimed in claim 1, wherein the plurality of the current values and the plurality of the voltage values are pair data of 100 pieces.

* * * * *